United States Patent
Uranishi et al.

(10) Patent No.: US 8,908,070 B2
(45) Date of Patent: Dec. 9, 2014

(54) SOLID STATE IMAGING DEVICE AND DIGITAL CAMERA

(75) Inventors: Taiju Uranishi, Saitama (JP); Mitsuru Okigawa, Saitama (JP)

(73) Assignee: FUJIFILM Corporation, Tokyo (JP)

(*) Notice: Subject to any disclaimer, the term of this patent is extended or adjusted under 35 U.S.C. 154(b) by 172 days.

(21) Appl. No.: 13/638,420
(22) PCT Filed: Apr. 28, 2011
(86) PCT No.: PCT/JP2011/060377
§ 371 (c)(1),
(2), (4) Date: Sep. 28, 2012
(87) PCT Pub. No.: WO2011/158567
PCT Pub. Date: Dec. 22, 2011

(65) Prior Publication Data
US 2013/0021508 A1 Jan. 24, 2013

(30) Foreign Application Priority Data
Jun. 18, 2010 (JP) .................. 2010-138885

(51) Int. Cl.
| H04N 3/14 | (2006.01) |
| H04N 5/335 | (2011.01) |
| H01L 27/148 | (2006.01) |
| H04N 5/369 | (2011.01) |
| H04N 5/232 | (2006.01) |

(52) U.S. Cl.
CPC .... *H01L 27/14831* (2013.01); *H01L 27/14806* (2013.01); *H04N 5/3696* (2013.01); *H04N 5/23212* (2013.01); *H01L 27/14818* (2013.01)
USPC ........................................ 348/294; 348/222.1

(58) Field of Classification Search
CPC .................................................. H04N 5/3696
USPC ............................................. 348/294, 222.1
See application file for complete search history.

(56) References Cited

U.S. PATENT DOCUMENTS 5,825,071 A * 10/1998 Takakura ....................... 257/440
5,898,209 A * 4/1999 Takakura ....................... 257/440
(Continued)

FOREIGN PATENT DOCUMENTS

| JP | 2003-78125 A | 3/2003 |
| JP | 2005-303409 A | 10/2005 |
(Continued)

OTHER PUBLICATIONS

English translation of the International Preliminary Report on Patentability and Written Opinion of the International Searching Authority (Forms PCT/IB/338, PCT/IB/373 and PCT/ISA/237) for International Application No. PCT/JP2011/060377, dated Jan. 24, 2013.

*Primary Examiner* — Antoinette Spinks
(74) *Attorney, Agent, or Firm* — Birch, Stewart, Kolasch & Birch, LLP

(57) ABSTRACT

A difference between sensitivity of one of focus detection pixels to incident light from an upper right oblique direction and sensitivity of the other focus detection pixel to incident light from an upper left oblique direction is eliminated.

An OFB layer 38 and a low concentration layer 39 are formed over a semiconductor substrate 29. A PD 40N that constitutes a normal pixel 30N, a PD 40R that constitutes a first focus detection pixel 30R, and a PD 40L that constitutes a second focus detection pixel 30L are formed in the low concentration layer 39. A high concentration barrier layer 38a positioned below a first photoelectric conversion area 52Ra of the PD 40R and a first photoelectric conversion area 52La of the PD 40L is formed in the OFB layer 38. Shapes of the photoelectric conversion areas of the PDs 40R and 40L become asymmetric due to application of voltage to the semiconductor substrate 29, and sensitivity of the photoelectric conversion area of the PD 40R to the incident light $I_R$ from the upper right oblique direction and sensitivity of the photoelectric conversion area of the PD 40L to the incident light $I_L$ from the upper left oblique direction increase. Because the OFB layer 38 is formed before formation of parts causing surface unevenness, for example, a transfer electrode, the difference between the sensitivities of the focus detection pixels 30R and 30L caused by influence of the surface unevenness is prevented.

17 Claims, 8 Drawing Sheets

(56) References Cited

U.S. PATENT DOCUMENTS

| | | |
|---|---|---|
| 8,243,189 B2 | 8/2012 | Kusaka |
| 2010/0188532 A1 | 7/2010 | Kusaka et al. |
| 2011/0310280 A1* | 12/2011 | Goto .............................. 348/302 |
| 2011/0317042 A1* | 12/2011 | Goto .............................. 348/241 |
| 2014/0145068 A1* | 5/2014 | Meynants ................. 250/208.1 |

FOREIGN PATENT DOCUMENTS

| | | |
|---|---|---|
| JP | 2007-81015 A | 3/2007 |
| JP | 2009-105682 A | 5/2009 |
| JP | 2009-162845 A | 7/2009 |
| JP | 2010-129783 A | 6/2010 |
| JP | 2010-213253 A | 9/2010 |

* cited by examiner

SOLID STATE IMAGING DEVICE AND DIGITAL CAMERA

TECHNICAL FIELD

The present invention relates to a solid state imaging device having a focus detection pixel that detects a phase difference and a digital camera provided with a solid state imaging device.

BACKGROUND ART

Digital cameras, each provided with a solid state imaging device such as a CCD image sensor or a CMOS image sensor to obtain digital images, are widely used (see patent document 1). Most of the digital cameras are provided with automatic focus function (hereinafter referred to as AF) that automatically adjusts focus of a taking lens. Functions of the digital cameras have been improved and prices of the digital cameras have been lowered. For example, improvements to speed up AF processing have been made without cost increase.

Patent document 2 discloses a digital camera which performs AF of a phase difference method. A solid state imaging device of the digital camera has normal pixels, first focus detection pixels, and second focus detection pixels. The normal pixel receives light incident through a normal opening section with its center coinciding with a center of a light receiving surface of a photodiode (hereinafter referred to as the PD). The first focus detection pixel receives light incident through a first off-center opening section with its center displaced in a first direction from the center of the light receiving surface of the PD. The second focus detection pixel receives light incident though a second off-center opening section with its center displaced in a second direction from the center of the light receiving surface of the PD. The second direction is opposite the first direction. The normal opening section and the first and second off-center opening sections are formed through a light shielding film covering a semiconductor substrate over which the PDs are formed. Furthermore, the size of each of the first and second off-center opening sections is smaller than that of the normal opening section. At the time of framing, the AF control of the phase difference method is carried out based on signals from the first and second focus detection pixels. At the time of imaging, an image of a subject is captured using the normal pixels and the first and second focus detection pixels.

In the solid state imaging device of the patent document 2, the first focus detection pixel has high sensitivity to incident light from a direction of the displacement of the first off-center opening section, and the second focus detection pixel has high sensitivity to incident light from a direction of the displacement of the second off-center opening section. For example, the first focus detection pixel has high sensitivity to the incident light from an upper right oblique direction, and the second focus detection pixel has high sensitivity to the incident light from an upper left oblique direction.

Patent documents 3 and 4 disclose a solid state imaging device provided with a phase-difference AF function and having a first focus detection pixel and a second focus detection pixel. By controlling a position and an area of a PD in each of the first and second focus detection pixels, the sensitivity of the first focus detection pixel to the incident light from the upper right oblique direction and the sensitivity of the second focus detection pixel to the incident light from the upper left oblique direction are increased.

In the digital camera provided with the solid state imaging device disclosed in the patent documents 2 to 4, an image formed using the first focus detection pixels and an image formed using the second focus detection pixels are shifted in right and left directions depending on the focus state of the taking lens. An amount of positional displacement between the two images corresponds to an amount of positional displacement of the focus of the taking lens. The two images coincide with each other when the taking lens is in focus, namely, the amount of the positional displacement is zero. The amount of the positional displacement between the two images increases as the amount of the positional displacement of the focus increases. Accordingly, a focus adjustment value of the taking lens is obtained by detecting a direction of the positional displacement of each image formed using the first or second focus detection pixels and the amount of the positional displacement between the two images.

When the solid state imaging device having the phase-difference AF function is used, there is no need to scan the focus lens, which makes the AF faster than that of a well-known contrast detection method using an output signal from the solid state imaging device.

PRIOR ART DOCUMENTS

Patent Documents

PATENT DOCUMENT 1: JAPANESE PATENT LAID-OPEN APPLICATION PUBLICATION NO. 2007-81015
PATENT DOCUMENT 2: JAPANESE PATENT LAID-OPEN APPLICATION PUBLICATION NO. 2005-303409
PATENT DOCUMENT 3: JAPANESE PATENT LAID-OPEN APPLICATION PUBLICATION NO. 2009-162845
PATENT DOCUMENT 4: JAPANESE PATENT LAID-OPEN APPLICATION PUBLICATION NO. 2009-105682

SUMMARY OF INVENTION

Problems to be Solved by the Invention

In the solid state imaging device disclosed in the patent document 2, the first and second off-center opening sections are formed through the light shielding film, so that the first and second off-center opening sections may differ in size because of influence of underlying uneven surface, for example, transfer electrodes below the light shielding film. This leads to a problem that the sensitivity of the first focus detection pixel to the incident light from the upper right oblique direction and the sensitivity of the second focus detection pixel to the incident light from the upper left oblique direction become different from each other.

In the solid state imaging device disclosed in the patent documents 2 to 4, because an opening area of the off-center opening section of each focus detection pixel is smaller than that of the normal opening section of the normal pixel, or an area of the PD of each focus detection pixel is smaller than that of the PD of the normal pixel, the sensitivity of each focus detection pixel and the sensitivity of the normal pixel are different from each other. For this reason, it is necessary to correct a signal outputted from each focus detection pixel.

An object of the present invention is to provide a solid state imaging device that eliminates the difference between the sensitivities of the two types of the focus detection pixels, and a digital camera provided with the solid state imaging device.

Means for Solving the Problems

In order to achieve the above objects, a solid state imaging device of the present invention includes a semiconductor substrate, an impurity layer formed over the semiconductor substrate, a plurality of pixels formed in a predetermined pattern over the impurity layer, and an area control layer. The pixels have photodiodes for generating signal charge through photoelectric conversion and accumulating the signal charge, and produce an image signal of a subject image formed by an optical system. The pixels include at least a pair of two types of focus detection pixels for producing an image signal for focus detection of the optical system using a phase difference method. The area control layer is formed between the semiconductor substrate and the two types of the focus detection pixels. The area control layer makes thickness of one of first and second photoelectric conversion areas less than thickness of the other in the photodiode of each of the two types of the focus detection pixels. The first photoelectric conversion areas of the photodiodes face toward each other. The second photoelectric conversion area is positioned on opposite side of the first photoelectric conversion area in each photodiode.

It is preferable that the area control layer is an overflow barrier layer having a first barrier layer and a second barrier layer. The first barrier layer is positioned below the first photoelectric conversion area. The second barrier layer is formed in an area other than the first barrier layer. The overflow barrier layer is formed between the semiconductor substrate and the impurity layer, and functions as a potential barrier against the signal charge from the photodiode to the semiconductor substrate. The semiconductor substrate is of a first conductive type. A first voltage is applied from a voltage application circuit to the semiconductor substrate. Impurity concentration of the second conductive type in the second barrier layer is lower than that in the first barrier layer. When the first voltage is applied to the semiconductor substrate, the potential barrier of the second barrier layer is lowered, and thereby the signal charge generated in a portion of the second photoelectric conversion area on the second barrier layer side is discharged to the semiconductor substrate. The potential barrier of the first barrier layer is maintained at a level to block the discharge of the signal charge from the first photoelectric conversion area to the semiconductor substrate.

It is preferable that, when a second voltage is applied to the semiconductor substrate, the potential barrier of the second barrier layer is maintained at a level to block the discharge of the signal charge to the semiconductor substrate from the second photoelectric conversion area. One of the first voltage and the second voltage lower than the first voltage is applied selectively from the voltage application circuit to the semiconductor substrate.

It is preferable that the area control layer is positioned between the first photoelectric conversion area and the semiconductor substrate, and has a shape in which a top face of the area control layer on the first photoelectric conversion area side is positioned higher than a bottom face of the second photoelectric conversion area.

It is preferable that a channel stopper is formed between the photodiodes adjacent to each other, and the area control layer is formed integrally with the channel stopper.

It is preferable that all the pixels are the two types of the focus detection pixels and normal pixels. The normal pixels are used only for imaging.

It is preferable that all the pixels are the two types of the focus detection pixels.

It is preferable to arrange a first pixel column and a second pixel column alternately. The first pixel column is composed of first pixels aligned in a line in a first direction. The first pixel is one of the pair of the focus detection pixels. The second pixel column is composed of second pixels aligned in a line in the first direction. The second pixel is the other of the pair of the focus detection pixels. The first and second pixel columns are arranged alternately in a second direction orthogonal to the first direction.

A digital camera of the present invention includes a solid state imaging device and an image processor. The solid state imaging device includes a semiconductor substrate, an impurity layer formed over the semiconductor substrate, first and second focus detection pixels formed over the impurity layer, and an area control layer. The first and second focus detection pixels have photodiodes for photoelectrically converting a subject image formed by an optical system and generating and accumulating the signal charge. The first and second focus detection pixels produce image signals for focus detection of the optical system using the phase difference method so as to control AF. The first and second focus detection pixels form a pattern in which the first and second pixel columns are arranged alternately. The first pixel column is composed of the first focus detection pixels aligned in a line in a first direction. The second pixel column is composed of the second focus detection pixels aligned in a line in the first direction. The first and second pixel columns are arranged alternately in a second direction orthogonal to the first direction. The area control layer is formed between the semiconductor substrate and the first and second focus detection pixels. The area control layer makes thickness of one of first and second photoelectric conversion areas less than thickness of the other in the photodiode of each of the two types of the focus detection pixels. The first photoelectric conversion areas of the photodiodes of the first and second photoelectric conversion areas face toward each other. The second photoelectric conversion area is positioned on opposite side of the first photoelectric conversion area in each photodiode. The image processor produces a disparity image composed of a first image and a second image. The first image is produced from the image signal from the first focus detection pixels. The second image is produced from the image signal from the second focus detection pixels.

Effect of the Invention

According to the present invention, the area control layer makes the thickness of one of the first photoelectric conversion area and the second photoelectric conversion area less than that of the other in the photodiode of each of the two types of the focus detection pixels. Thereby, the two types of the focus detection pixels are formed without being affected by the surface unevenness caused by the transfer electrodes and the like. As a result, there is no difference between the sensitivity of one of the focus detection pixels to the incident light from the upper right oblique direction and the sensitivity of the other focus detection pixel to the incident light from the upper left oblique direction, for example.

With the use of the overflow barrier layer, having areas with different impurity concentrations, as the area control layer, the thickness of one of the first and second photoelectric conversion areas is made less than that of the other in each of the photodiodes by switching the magnitude of the voltage applied to the semiconductor substrate. Thereby, the shape of the photoelectric conversion area of the normal pixel and that of the focus detection pixel are substantially the same except for the time of the focus detection. Accordingly, the sensitivity of the normal pixel is substantially equivalent to that of the focus detection pixel. As a result, unlike the conventional manner, there is no need to correct the signal output from the focus detection pixel.

MODE FOR CARRYING OUT THE INVENTION

Figure 1:
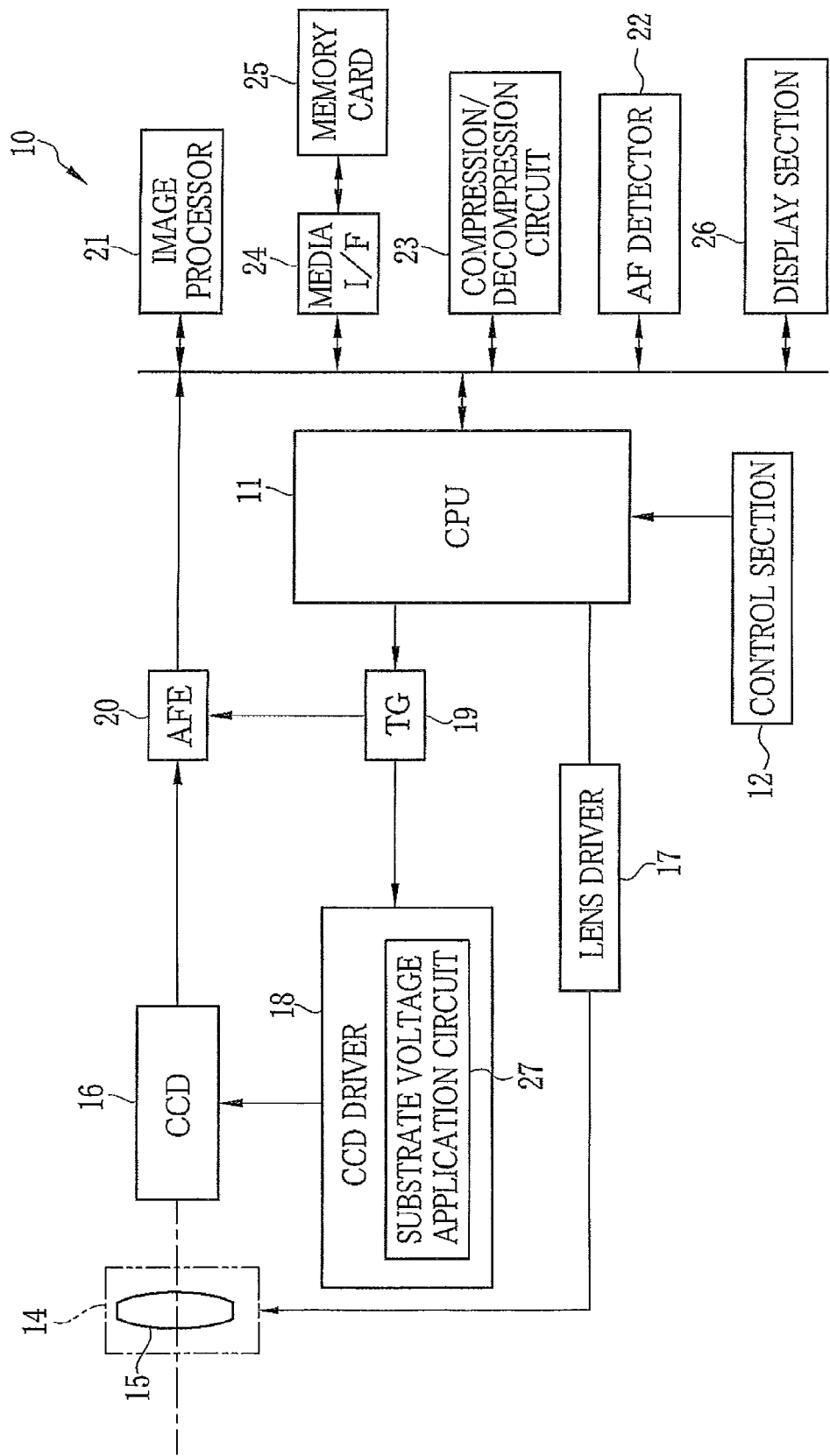
FIG. 1 is a block diagram showing an electric configuration of a digital camera.

As shown in FIG. 1, a CPU 11 of a digital camera 10 sequentially runs various programs and data read out from a memory (not shown) to control each section of the digital camera 10, based on a control signal from a control section 12 composed of a shutter button and various operation buttons.

A lens unit 14 incorporates a focusing mechanism and an aperture stop mechanism (both not shown), in addition to a taking lens 15. The focusing mechanism carries out AF processing to move a focus lens, incorporated in the taking lens 15, to focus on a subject. The aperture stop mechanism adjusts an aperture diameter of the aperture stop to adjust intensity of subject light incident on a CCD 16. Operation of the focusing mechanism and the aperture stop mechanism are controlled by the CPU 11 through a lens driver 17.

The CCD 16 is disposed behind the taking lens 15, and converts the subject light from the taking lens 15 into an electrical image signal and outputs the electrical image signal. A CCD driver 18 is connected to the CCD 16. The CCD driver 18 is driven by a synchronization pulse from a TG (timing Generator) 19, and controls charge accumulation time of the CCD 16 and timing of reading and transferring charge of the CCD 16.

The image signal outputted from the CCD 16 is inputted to an AFE 20. Based on the synchronization pulse inputted from the TG 19, the AFE 20 operates in synchronization with charge reading and transferring operation of the CCD 16. The AFE 20 is composed of a CDS (Correlated Double Sampling) circuit, an AGC (Automatic Gain Control Amplifier), and an A/D converter. The CDS circuit performs correlated double sampling to remove noise from the image signal. The AGC circuit amplifies the image signal with a gain corresponding to sensitivity set by the CPU 11. The A/D converter converts an analog image signal from the AGC circuit into a digital image signal and outputs the digital image signal.

An image processor 21 performs various image processing steps such as gradation conversion, white balance correction, gamma correction processing, and YC correction processing to the image signal inputted from the AFE 20 to produce image data. Based on the image signal inputted from the AFE 20, an AF detector 22 calculates a focus adjustment value to adjust focus of the taking lens 15 onto the subject. Based on the focus adjustment value calculated by the AF detector 22, the CPU 11 controls the lens driver 17 to perform the AF processing.

A compression/decompression circuit 23 performs compression processing on the image data processed in the image processor 21. The compression/decompression circuit 23 performs decompression processing on compressed image data obtained from a memory card 25 through a media I/F 24. The media I/F writes and reads the image data to and from the memory card 25. A display section 26 includes an LCD and displays a through image, a reproduced image, or the like.

The CCD driver 18 is provided with a substrate voltage application circuit 27. The substrate voltage application circuit 27 applies voltage to a semiconductor substrate 29 (see FIG. 3) that constitutes the CCD 16. The voltage is applied during an electronic shutter period before the start of imaging or during the AF processing, for example.

Figure 2:
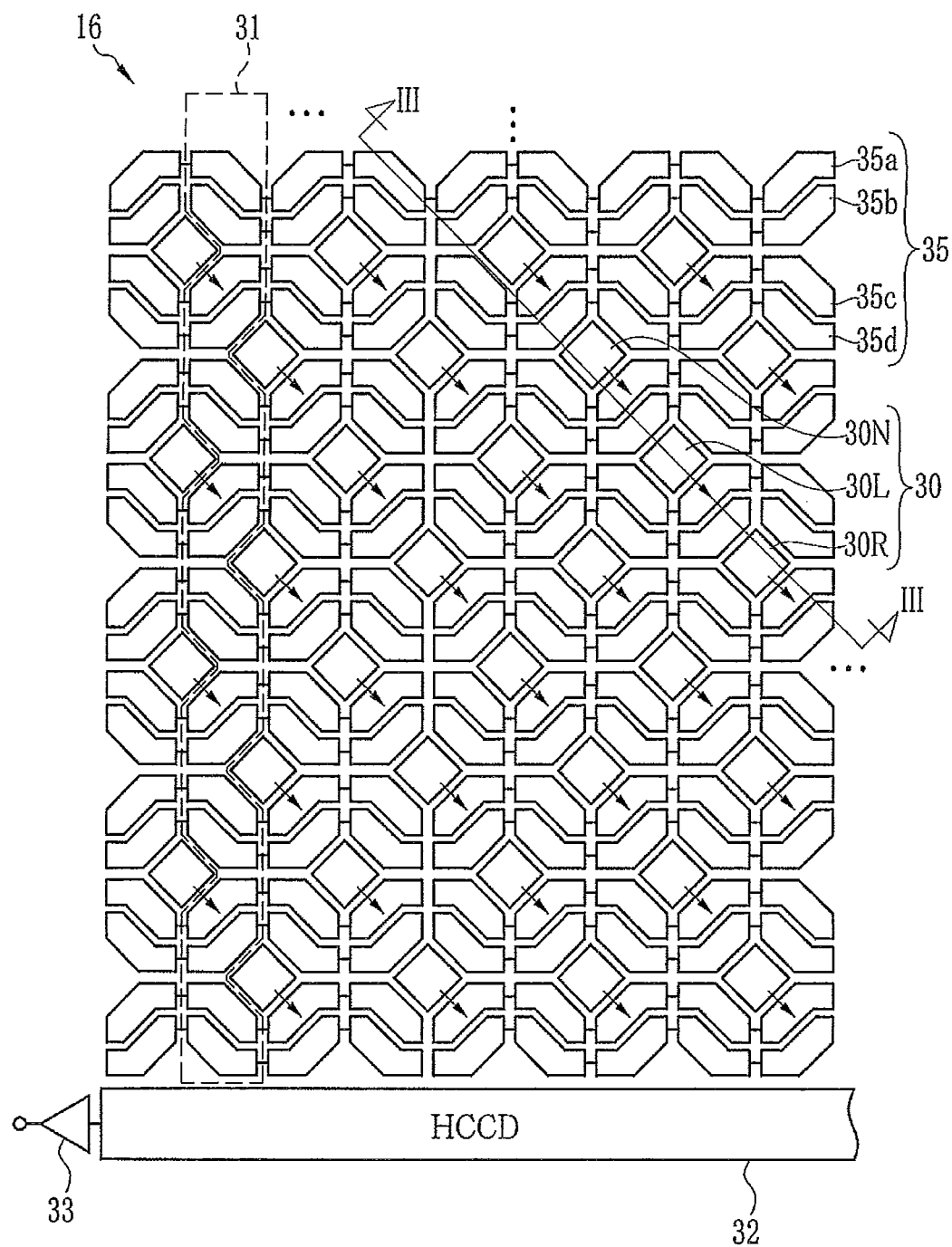
FIG. 2 is a schematic plan view of a CCD-type image sensor.

As shown in FIG. 2, the CCD 16 has a plurality of pixels 30, a plurality of vertical charge transfer sections (VCCD) 31, a horizontal charge transfer section (HCCD) 32, and an output section 33. The pixels 30 are arranged in two dimensions over the semiconductor substrate 29, and each pixel photoelectrically converts the subject light into signal charge. Each VCCD 31 transfers the signal charge, produced in each pixel 30, in a vertical direction in the drawing. The HCCD 32 is connected to an end of each VCCD 31, and transfers the signal charge, transferred through each VCCD 31, in a horizontal direction in the drawing. The output section 33 converts the signal charge, transferred from the HCCD 32, into a voltage signal, and outputs the voltage signal.

The Pixels 30 are arranged in a honeycomb array. The VCCD 31 is provided per column of pixels 30. A read channel, illustrated schematically as an arrow in the drawing, is formed between each column of the pixels 30 and the VCCD 31 corresponding to the column of the pixels 30. The signal charge, produced and accumulated in each pixel 30 in an exposure period, is read out to the VCCD 31 through the read channel.

The VCCD 31 is formed in a layer over the semiconductor substrate 29, in a tortuous manner between the pixels 30. A vertical transfer electrode 35 is provided over a surface of the semiconductor substrate 29. The vertical transfer electrode 35 is composed of first to fourth vertical transfer electrodes 35a to 35d disposed across the VCCD 31 in the horizontal direction in the drawing and bent so as to avoid the pixels 30 and arranged one after another in the vertical direction in the drawing. The VCCD 31 is driven by vertical transfer pulses of four phases applied to the respective first to fourth vertical transfer electrodes 35a to 35d.

The HCCD 32 is driven by horizontal transfer pulses of two phases applied to horizontal transfer electrodes (not shown) provided above the HCCD 32. The output section 33 is connected to an end of the HCCD 32. The output section 33 is constituted of an FD amplifier composed of a floating diffusion section that converts charge into voltage and a source follower circuit.

Each pixel 30 is composed of a normal pixel 30N, a first focus detection pixel 30R, and a second focus detection pixel 30L. Each of the pixels 30N, 30R, 30L is arranged in a predetermined pattern, and is composed of a PD that converts incident light into signal charge and accumulates the signal charge, and the like.

The normal pixels 30N are used to produce an image, for example, when the image is displayed as the through image or when image capture is performed. The first and second focus detection pixels 30R and 30L are used for AF of a phase difference method (hereinafter simply referred to as the AF). The first and second focus detection pixels 30R and 30L are also used to produce an image. The first and second focus detection pixels 30R and 30L have high sensitivity to incident light from respective different directions during the AF processing.

Figure 3:
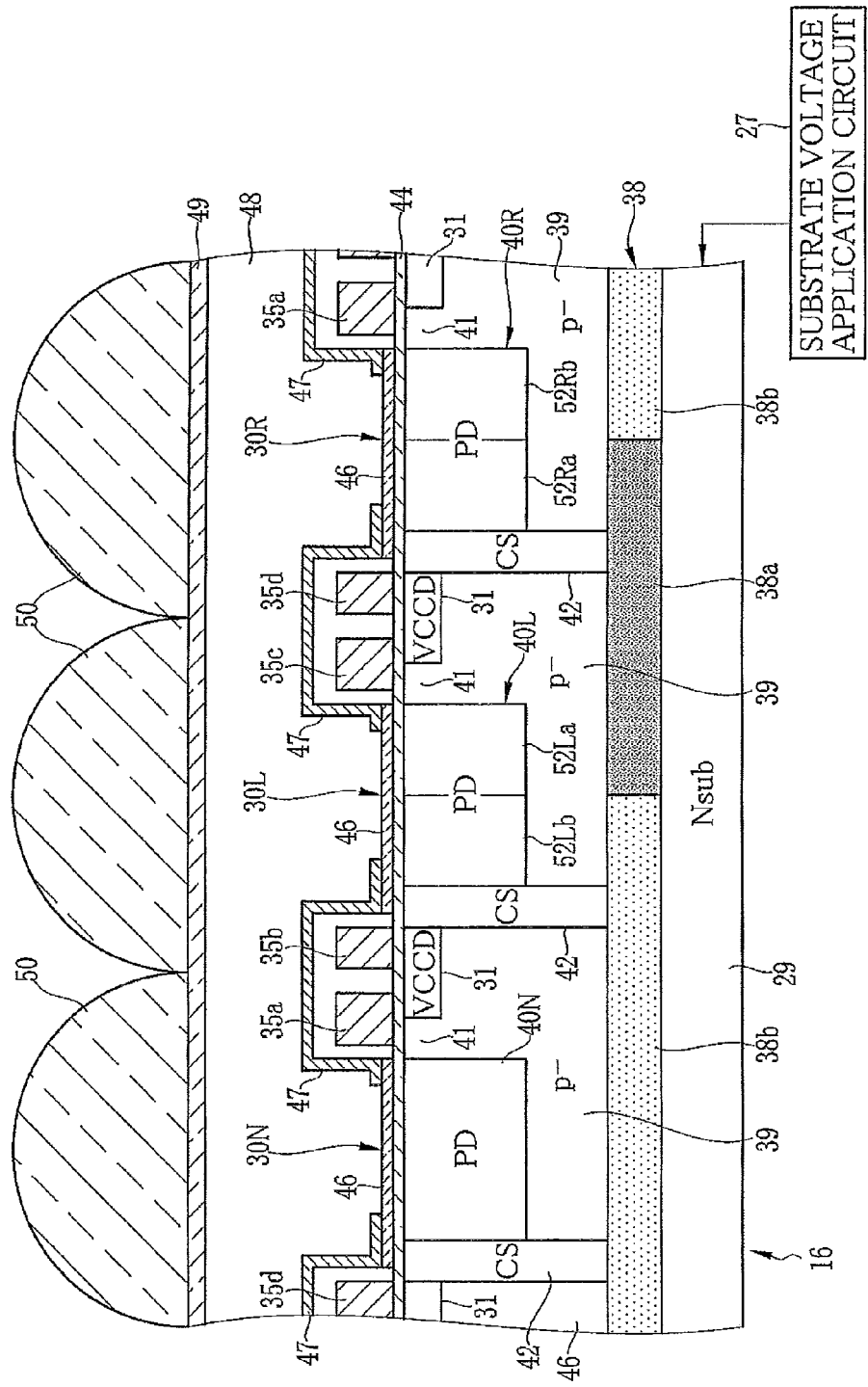
FIG. 3 is a cross-sectional view cut along a line III-III in FIG. 2.

In FIG. 3, a p type (second conductivity type) overflow barrier layer (hereinafter simply referred to as the OFB layer) 38 is formed on the semiconductor substrate 29 (Nsub) composed of n type (first conductivity type) silicon. A p⁻ type low concentration impurity layer (hereinafter simply referred to as the low concentration layer) 39 that corresponds to an impurity layer of the present invention is formed over the OFB layer 38.

A PD 40N that constitutes the normal pixel 30N, a PD 40R that constitutes the first focus detection pixel 30R, and a PD 40L that constitutes the second focus detection pixel 30L are formed over the low concentration layer 39, and each of the PD 40N, the PD 40R, and the PD 40L is composed of an n type layer. The VCCD 31 composed of the n type layer is formed on one of sides of each of the PDs 40N, 40R, and 40L, through a read channel 41, being an upper portion of the low concentration layer 39. The VCCD 31 corresponding to the adjacent pixel is formed on the other side of each of the PDs 40N, 40R, and 40L, through a channel stopper 42 composed of a p⁺ type layer.

A light-transmissive gate insulation film 44 composed of, for example, silicon dioxide ($SiO_2$) is formed over the low concentration layer 39. A light-transmissive anti-reflection film 46 containing, for example, silicon nitride (SiN) is formed over the gate insulation film 44, in a position above each of the PDs 40N, 40R, and 40L.

The first to fourth vertical transfer electrodes 35a to 35d, each composed of polysilicon and the like, are formed over the gate insulation film 44 to cover substantially right over the VCCD 31, the read channel 41, and the channel stopper 42. The first to fourth vertical transfer electrodes 35a to 35d function as drive electrodes that drive that allow the VCCD 31 to transfer the charge. The first and third vertical transfer electrodes 35a and 35c function as read electrodes that drive and allow the read channel 41 to read the charge.

A light shielding film 47 composed of, for example, tungsten is formed over the gate insulation film 44 and the anti-reflection film 46 so as to cover the first to fourth vertical transfer electrodes 35a to 35d. The light shielding film 47 is formed with openings right above the respective PDs 40N, 40R, and 40L, and shields areas other than the openings from the light.

A light-transmissive planarizing layer 48 having a flat surface is formed over the light shielding film 47. A color filter 49 is formed over the planarizing layer 48. A microlens 50 is formed over the color filter 49, in a position right over each of the PDs 40N, 40R, and 40L.

The CCD 16 has a vertical overflow drain structure to discharge the signal charge, remained in each of the PDs 40N, 40R, and 40L in the electronic shutter period before the accumulation of the signal charge in each of the PDs 40N, 40R, and 40L, to the semiconductor substrate 29. The OFB layer 38 functions as a potential barrier to the signal charge accumulated in each of the PDs 40N, 40R, and 40L. The semiconductor substrate 29 absorbs the signal charge injected into the semiconductor substrate 29 over the potential barrier of the OFB layer 38.

The OFB layer 38 is a p type impurity layer, and is composed of a high concentration barrier layer (first barrier layer) 38a and a low concentration barrier layer (second barrier layer) 38b with different impurity concentrations from each other. Because the impurity concentration of the high concentration barrier layer 38a is higher than that of the low concentration barrier layer 38b, the high concentration barrier layer 38a has a high level of the potential barrier against the signal charge. The high concentration barrier layer 38a is formed below first photoelectric conversion areas 52Ra and 52La.

The first photoelectric conversion areas 52Ra and 52La, being portions of the respective PD 40R and PD 40L, face toward each other. The low concentration barrier layer 38b is formed in a portion other than the high concentration barrier layer 38a. Because the impurity concentration of the low concentration barrier layer 38b is lower than that of the high concentration barrier layer 38a, the low impurity concentration has a low level of the potential barrier against the signal charge. Note that the photoelectric conversion area is an area in which the light is converted into the charge and the charge is accumulated.

The OFB layer 38 is formed using various methods, for example, by controlling an amount of the impurity implanted or a rate of implanting the impurity. Thereby, the impurity concentration of the OFB layer 38 positioned below the first photoelectric conversion areas 52Ra of the PD 40R and 52La of the PD 40L increases. On the contrary, the impurity concentration of the OFB layer 38 positioned below second photoelectric conversion areas 52Rb and 52Lb, positioned on opposite sides of the respective first photoelectric conversion areas 52Ra and 52La, decreases.

The substrate voltage application circuit 27 applies the voltage to the semiconductor substrate 29. The substrate voltage application circuit 27 switches magnitude of the voltage applied to the semiconductor substrate 29 so as to vary a level of the potential barrier of the OFB layer 38. Because the OFB layer 38 is composed of the high concentration barrier layer 38a and the low concentration barrier layer 38b, characteristics of a change in the potential barrier level in the high concentration barrier layer 38 are different from those in the low concentration barrier layer 38b. The change in the potential barrier level is more likely to occur in the low concentration barrier layer 38b than in the high concentration barrier layer 38a. Accordingly, a maximum potential point K (see FIGS. 4 and 5) of the potential barrier against the signal charge moves easily in the low concentration barrier layer 38b in accordance with the voltage applied to the semiconductor substrate 29, but is not likely to move in the high concentration barrier layer 38a.

The voltage applied from the substrate voltage application circuit 27 to the semiconductor substrate 29 is set to "Vhigh" in the electronic shutter period, and "Vmid" (first voltage) lower than the Vhigh in the AF processing, and "Vlow" (second voltage) lower than the Vmid when the image is formed, for example, when the through image is displayed or the image capture is performed, namely, in a signal accumulation period.

The voltage value Vhigh shifts the maximum potential point K to surface sides of the respective PDs 40N, 40R, and 40L such that all the signal charge accumulated in each of the PDs 40N, 40R, and 40L is discharged to the semiconductor substrate 29. The voltage value Vmid shifts the maximum potential point K such that the signal charge generated in a part of each of the PDs 40R and 40L is discharged to the semiconductor substrate 29. The voltage value Vlow makes the maximum potential point K stay in the OFB layer 38, which prohibits the discharge of the charge from each of the PDs 40N, 40R, and 40L.

Figure 4:
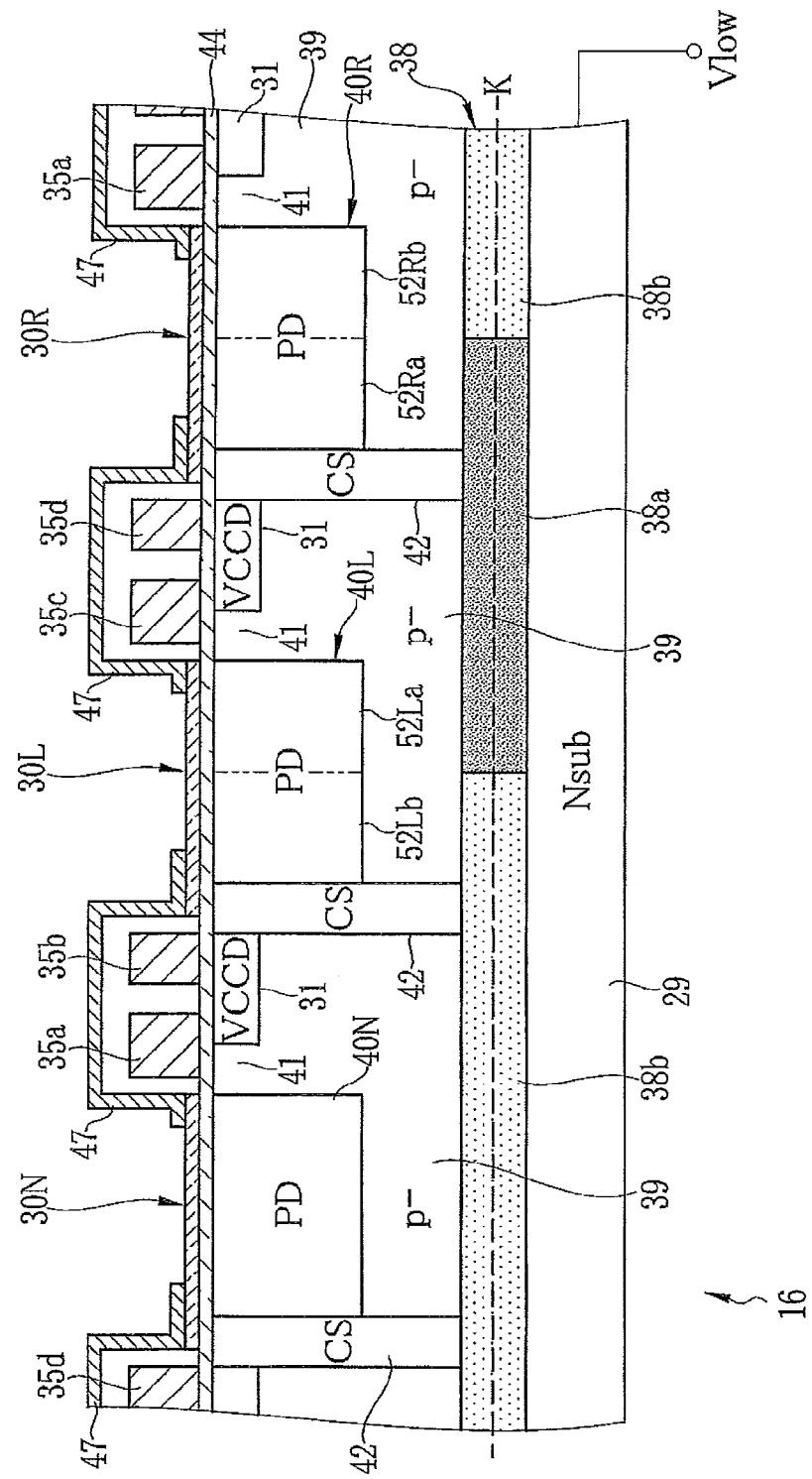
FIG. 4 is an explanatory view describing a photoelectric conversion area of each PD with a voltage Vlow applied to a semiconductor substrate.

Next, operation of the above-configured CCD 16 is described. As shown in FIG. 4, when the image is formed, the voltage applied from the substrate voltage application circuit 27 to the semiconductor substrate 29 is set to the Vlow. In this case, the potential barrier of each of the concentration barrier layers 38a and 38b is maintained at the level which prohibits the discharge of the signal charge from each of the PDs 40N, 40R, and 40L to the semiconductor substrate 29. The maximum potential point K (shown by a dotted line) in the concentration barrier layers 38a and 38b are positioned at similar levels with each other. Thereby, there is no difference in shape among the photoelectric conversion area of the PD 40N and each of the photoelectric conversion areas of the PDs 40R and 40L. Thus, the sensitivity of the normal pixel 30N is equivalent to the sensitivity of each of the first and second focus detection pixels 30R and 30L. As a result, unlike the conventional manner, there is no need to correct the signal outputs of the respective first and second focus detection pixels 30R and 30L to form the image. One frame of image data is produced from the image signal from the normal pixels 30N and the first and second focus detection pixels 30R and 30L.

Figure 5:
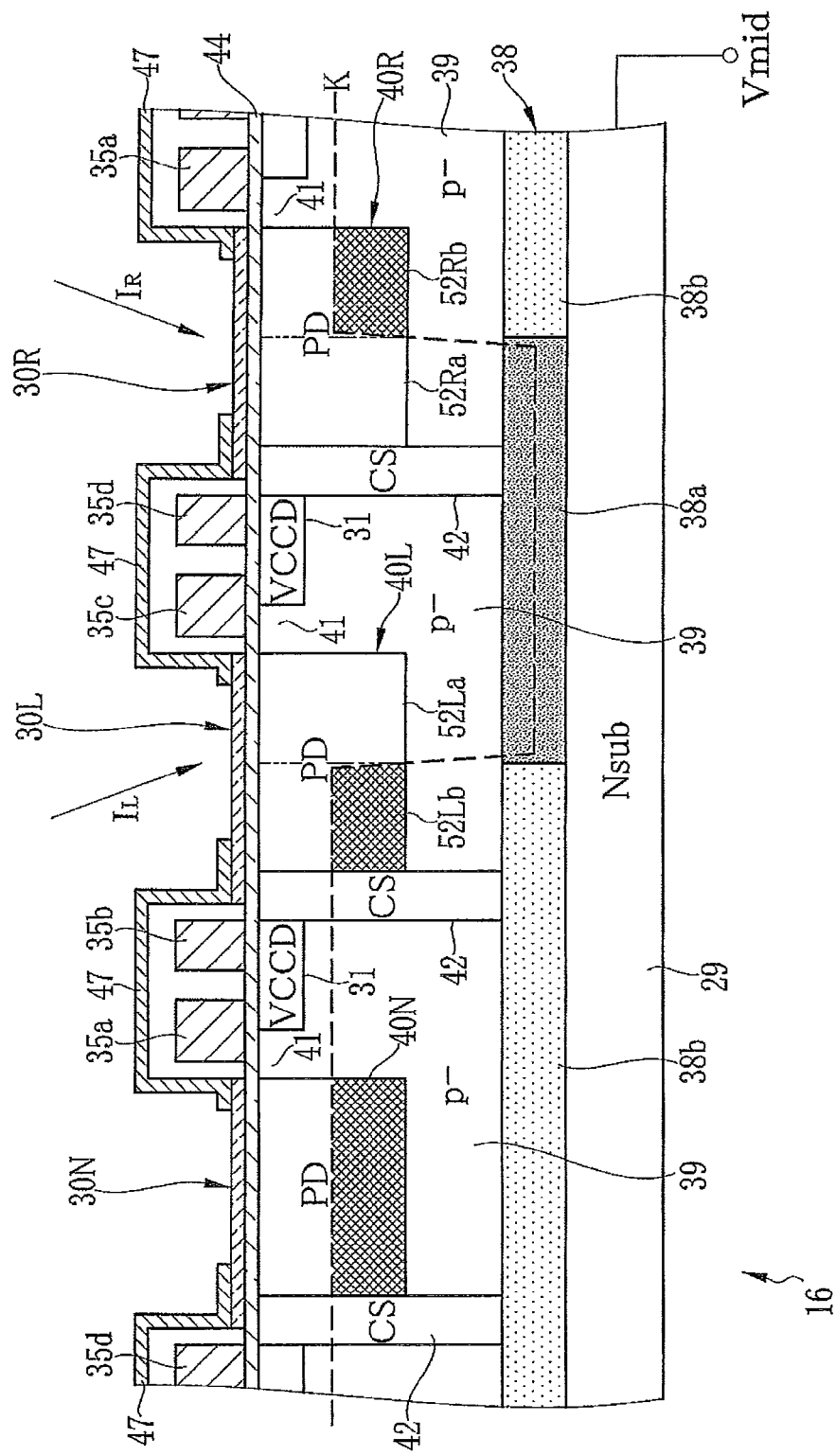
FIG. 5 is an explanatory view describing a photoelectric conversion area of each PD with a voltage Vmid applied to the semiconductor substrate.

As shown in FIG. 5, in the AF processing, the voltage applied from the substrate voltage application circuit 27 to the semiconductor substrate 29 is set to the Vmid. Thereby, the potential barrier is lowered in the low concentration barrier layer 38b with low impurity concentration, and the maximum potential point K move toward the surface side of the CCD 16. Thereby, the signal charge generated in a portion of each of the second photoelectric conversion areas 52Rb and 52Lb on the low concentration barrier layer 38b side, more specifically, in the portion (with half-tone dot meshing in the drawing) on the low concentration barrier layer 38b side and below the maximum potential point K is discharged to the semiconductor substrate 29. Accordingly, in the second photoelectric conversion areas 52Rb and 52Lb, the signal charge generated on the surface side of the CCD 16 is accumulated.

The potential barrier level of the high concentration barrier layer 38a with the high impurity concentration hardly changes, which causes the maximum potential point K not to move toward the CCD 16 or to move slightly to the surface side of the CCD 16. In this case, the discharge of the signal charge to the semiconductor substrate 29 from the first photoelectric conversion areas 52Ra and 52La is blocked. Thereby, the signal charge generated in the entire first photoelectric conversion areas 52Ra and 52La is accumulated in the first photoelectric conversion areas 52Ra and 52La.

In the AF processing, the thickness of the second photoelectric conversion area 52Rb is less than the thickness of the first photoelectric conversion area 52Ra of the PD 40R, in a direction vertical to the semiconductor substrate, and the thickness of the second photoelectric conversion area 52Lb is less than the thickness of the first photoelectric conversion area 52La of the PD 40L in the direction vertical to the semiconductor substrate. As a result, the shapes of the photoelectric conversion areas in each of the PDs 40R and 40L are asymmetric to each other. Thereby, the first focus detection pixel 30R has high sensitivity to incident light $I_R$ from an upper right oblique direction in the drawing. The second focus detection pixel 30L has high sensitivity to incident light $I_L$ from an upper left oblique direction in the drawing.

In a production process of the CCD 16, because the OFB layer 38 is formed before formation of each of the vertical transfer electrodes 35a to 35d, the concentration barrier layers 38a and 38b and the like are not affected and changed by surface unevenness. As a result, there is no difference between the sensitivity of the first focus detection pixel 30R to the incident light $I_R$ and the sensitivity of the second focus detection pixel 30L to the incident light $I_L$.

The image processor 21 produces an image (hereinafter referred to as the first focus detection image) from the image signal from the first focus detection pixels 30R and an image (hereinafter referred to as the second focus detection image) from the image signal of the second focus detection pixels 30L. The first and second focus detection images shift in right and left directions in accordance with the focus state of the taking lens 15. The AF detector 22 detects a direction of displacement between the first and second focus detection images and an amount of displacement between the first and second focus detection images to obtain a focus adjustment value of the taking lens 15. Based on the focus adjustment value, the CPU 11 controls the lens driver 17 to perform the AF processing. Note that the AF of the phase difference method is described in detail in Japanese Patent No. 2959142, for example.

In the electronic shutter period, the voltage applied from the substrate voltage application circuit 27 to the semiconductor substrate 29 is set to the Vhigh, so that all the signal charge accumulated in each of the PDs 40N, 40R, and 40L is discharged to the semiconductor substrate 29. Note that the magnitude of each of the voltages Vlow, Vmid, and Vhigh is determined by an experiment, simulation, or the like, depending on the structure of the CCD 16, and material, shape, thickness of each part of the CCD 16, for example.

Figure 6:
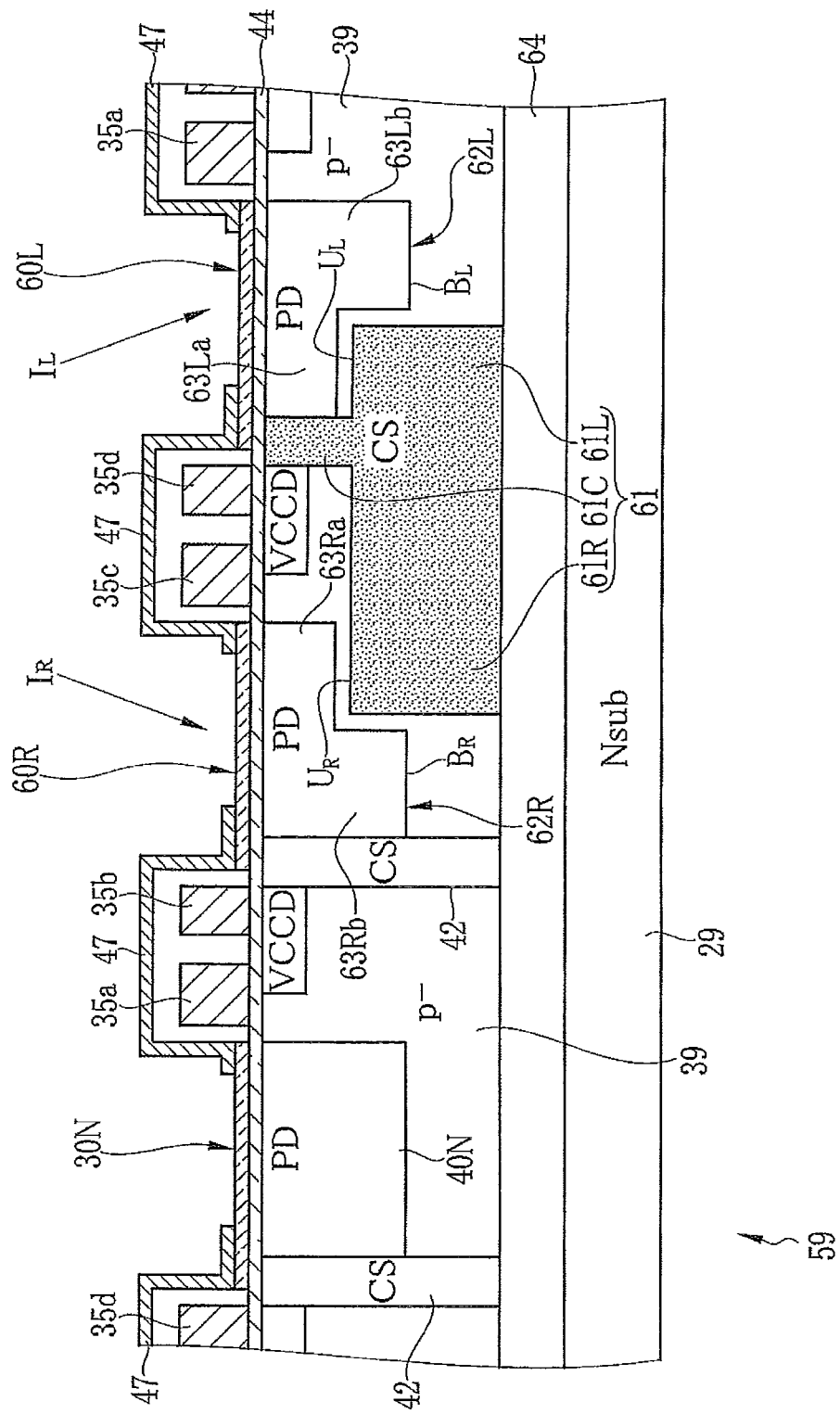
FIG. 6 is a cross-sectional view of a CCD-type image sensor of a second embodiment.

Next, referring to FIG. 6, a CCD 59 of the second embodiment of the present invention is described. In the CCD 16 of the first embodiment, the OFB layer 38 with the different impurity concentrations is formed, which increases the sensitivity of the first focus detection pixel 30R to the incident light $I_R$ and the sensitivity of the second focus detection pixel 30L to the incident light $I_L$. On the other hand, in the CCD 59, changing the shape of a channel stopper (hereinafter simply referred to as the CS) between the first and second focus detection pixels 60R and 60L increases the sensitivity of the first focus detection pixel 60R to the incident light $I_R$ and the sensitivity of the second focus detection pixel 60L to the incident light $I_L$.

The configuration of the CCD 59 is basically the same as that of the CCD 16 of the first embodiment except for positions in which a pair of the first and second focus detection pixels 60R and 60L is formed, a shape of a CS 61 (shown by dots) positioned between the focus detection pixels 60R and 60L, and shapes of PDs 62R and 62L of the respective focus detection pixels 60R and 60L. Accordingly, structurally or functionally like parts are denoted by like numerals, and descriptions thereof are omitted.

The CS 61 that corresponds to an area control layer of the present invention is a p$^+$ type impurity layer. The CS 61 is composed of a first area control portion 61R positioned between a first photoelectric conversion area 63Ra of the PD 62R and the OFB layer 64, a second area control portion 61L positioned between a first photoelectric conversion area 63La of the second PD 62L and the OFB layer 64, and a CS body portion 61C positioned between the VCCD 31 and the PD 62L.

The first area control portion 61R is formed such that its upper face $U_R$ is positioned higher than a bottom face $B_R$ of the second photoelectric conversion area 63Rb. Thereby, the PD 62R has an asymmetric shape in which the thickness of the first photoelectric conversion area 63Ra is less than that of the second photoelectric conversion area 63Rb. Thus, the PD 62R has high sensitivity to the incident light $I_R$ from the upper right oblique direction.

The second area control portion 61L is formed such that its upper face $U_L$ is positioned higher than a bottom face $B_L$ of the second photoelectric conversion area 63Lb. Thereby, the PD 62L has an asymmetric shape in which the thickness of the first photoelectric conversion area 63La is less than that of the second photoelectric conversion area 63Lb. Thus, the PD 62L has high sensitivity to the incident light $I_L$ from the upper left oblique direction.

In the CCD 59, the focus detection pixel 60R has high sensitivity to the incident light $I_R$ and the focus detection pixel 60L has high sensitivity to the incident light $I_L$. This allows the AF processing to be performed based on the first focus detection image produced from the image signal from the first focus detection pixels 60R and the second focus detection image produced from the image signal from the second focus detection pixels 60L, in a manner similar to the first embodiment. Because the CS 61 and the PDs 62R and 62L are formed before the formation of the vertical transfer electrodes 35a to 35d, the CS 61 and the PDs 62R and 62L are free from the influence of the surface unevenness. As a result, there is no difference between the sensitivity of the first focus detection pixel 60R to the incident light $I_R$ and the sensitivity of the second focus detection pixel 60L to the incident light $I_L$.

In the second embodiment, the shapes of the photoelectric conversion areas of the PDs 62R and 62L are controlled by the CS 61. Each of the area control portions 61R and 61L may be formed separately from the CS. The shape of the CS 42 may be changed instead of the shape of the CS 61.

In the CCDs 16 and 59 of the above embodiments, configurations and shapes of parts for example, electrodes and various layers formed over the gate insulation film 44 are not limited to those described in the above embodiments, and may be changed as necessary. The conductivity type of each semiconductor layer of the CCDs 16 and 59 may be reversed (from the p type to the n type, and from the n type to the p type), and the signal charge may be a positive hole instead of an electron.

In the above first embodiment, the high concentration barrier layer 38a is formed below the first photoelectric conversion areas 52Ra and 52La, and the low concentration barrier layer 38b is formed below the second photoelectric conversion areas 52Rb and 52Lb. The positions for forming the barrier layers 38a and 38b may be transposed.

In the above embodiments, the CCD with the pixels arranged in the honeycomb array is described. The present invention is also applicable to a CCD with pixels arranged in a square lattice form or the like. For example, when the first and second focus detection pixels 30R and 30L are arranged in the square lattice form, the digital camera 10 functions as a single-lens 3D camera that produces an L-viewpoint image and an R-viewpoint image for stereo image display. In this case, the display section 26 reproduces and displays the stereo image using a well-known stereo display method, for example, a lenticular method using a lenticular lens (not shown).

Figure 7:
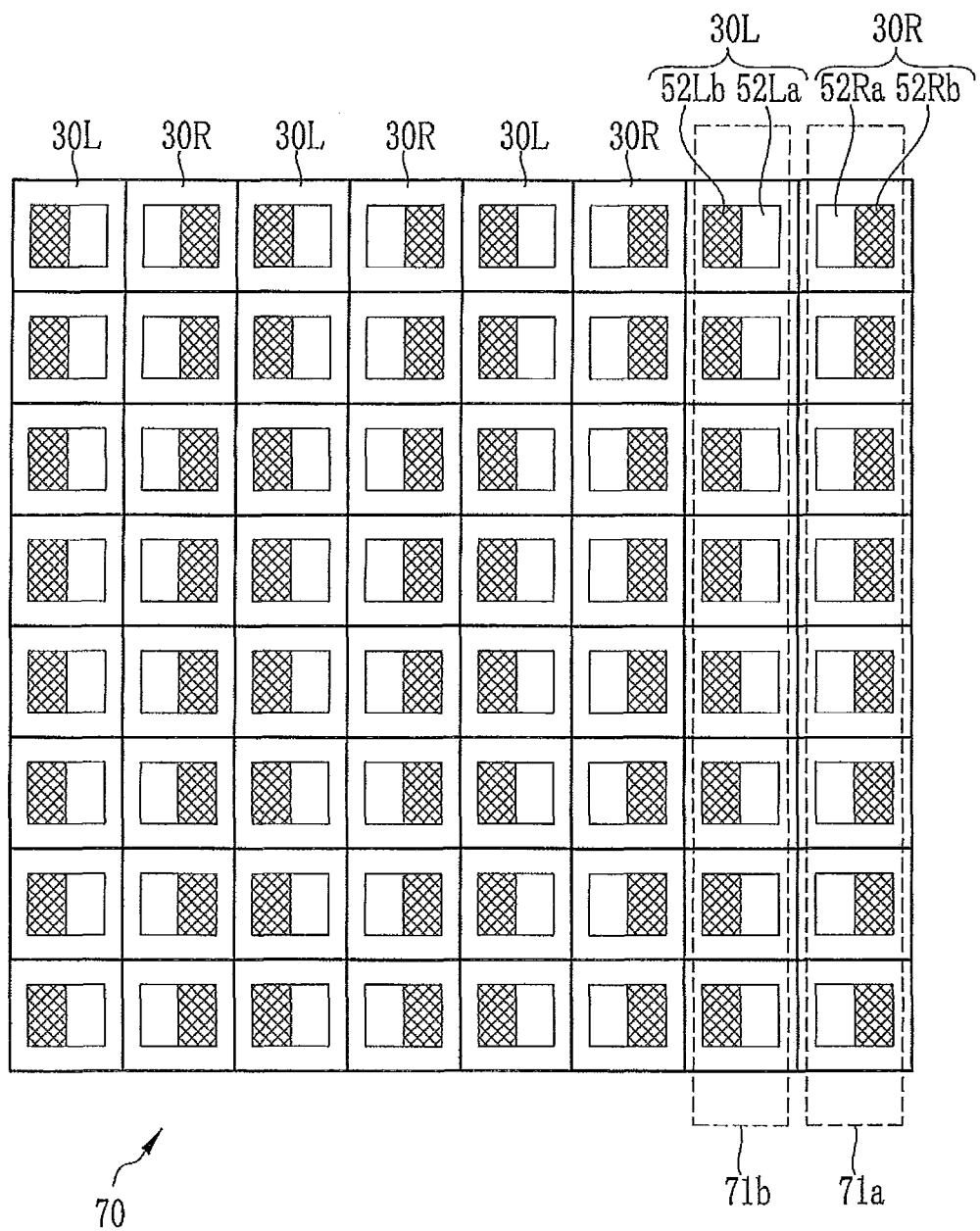
FIG. 7 is a schematic plan view of the CCD-type image sensor composed of first and second focus detection pixels of a first embodiment.

As shown in FIG. 7, in a CCD 70, all of the pixels are arranged in first pixel columns 71a and second pixel columns 71b arranged alternately in a horizontal direction (second direction) in the drawing. In each of the first pixel columns 71a, the first focus detection pixels 30R are arranged in a vertical direction (first direction) in the drawing. In each of the second pixel columns 71b, the second focus detection pixels 30L are arranged in the vertical direction in the drawing.

The image processor 21 produces the first focus detection image and the second focus detection image. The first focus detection image is produced from the image signal from the first focus detection pixels 30R. The second focus detection image is produced from the image signal from the second focus detection pixels 30L, in a manner similar to the first embodiment.

With the use of the OFB layer 38 shown in FIG. 5, the sensitivity of the first focus detection pixel 30R to the incident light $I_R$ increases, and the sensitivity of the second focus detection pixel 30L to the incident light $I_L$ increases. This causes disparity between the first focus detection image and the second focus detection image. To be more specific, the first focus detection image is used as the R-viewpoint image, and the second focus detection image is used as the L-viewpoint image.

The CPU 11 produces stripe image data in which linear images, being linearly divided portions of the first focus detection image obtained from the CCD 70, and linear images, being linearly divided portions of the second focus detection image obtained from the CCD 70, are arranged alternately. The stripe image data is outputted to the display section 26. Below each of the lenticular lenses of the display section 26, two adjacent linear images are displayed. Through the lenticular lenses, the left eye and the right eye observe the respective first and second focus detection images with disparity, and thus a stereo image is observed. A method for displaying the stereo image is not limited to the lenticular method. A well-known stereo display method, for example, a disparity barrier method, a parallax barrier method, an anaglyphic method, a frame sequential method, or a light direction method may be used.

In FIG. 7, the CCD 70 with all the pixels being the first and second focus detection pixels 30R and 30L of the first embodiment is described by way of example. All the pixels of the CCD may be the first and second focus detection pixels 60R and 60L of the second embodiment.

Figure 8:
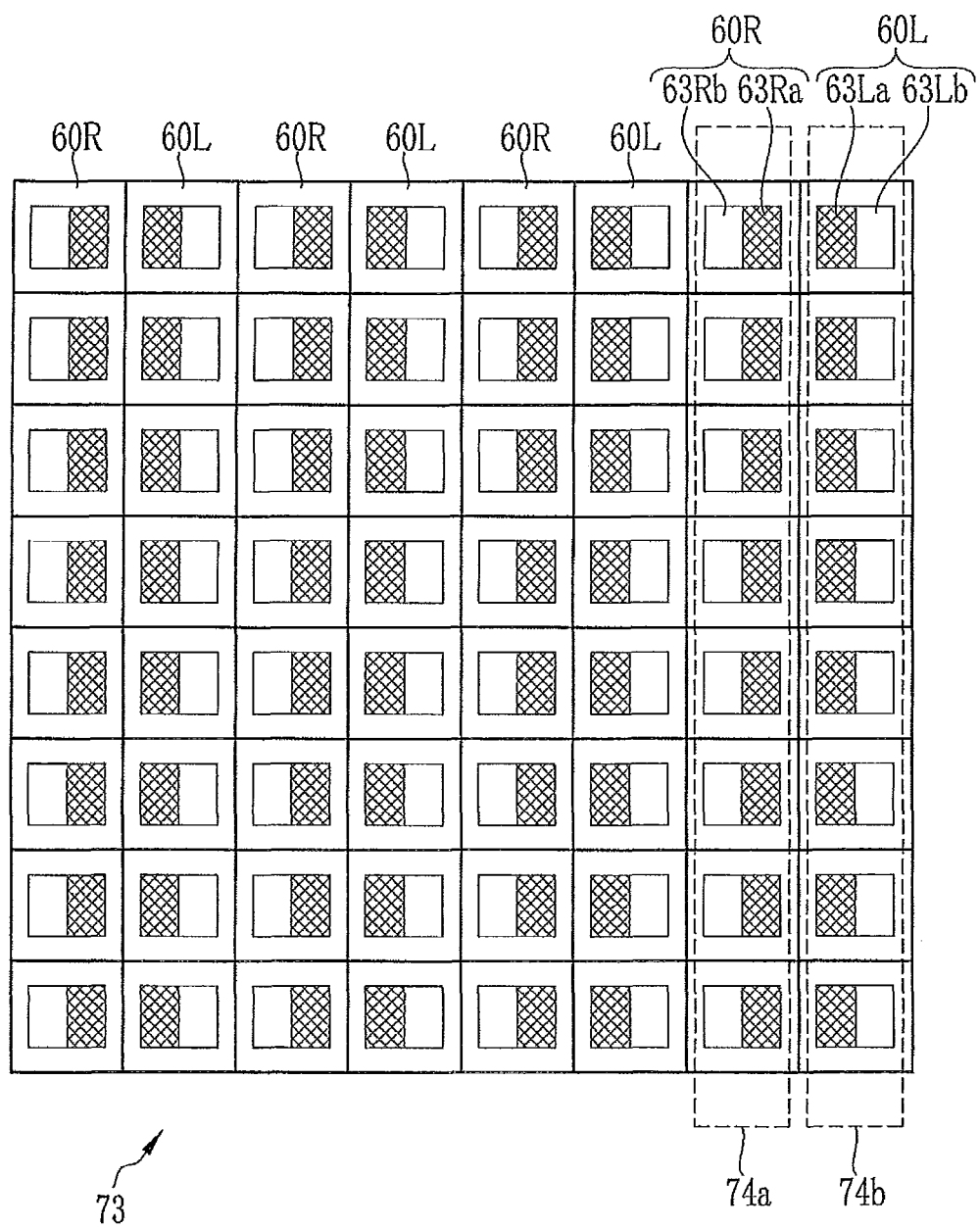
FIG. 8 is a schematic plan view of the CCD-type image sensor composed of first and second focus detection pixels of the second embodiment.

As shown in FIG. 8, in a CCD 73, all of the pixels are arranged in first pixel columns 74a and second pixel columns 74b arranged alternately in a horizontal direction in the drawing. In each of the first pixel columns 74a, the first focus detection pixels 60R are arranged in a vertical direction in the drawing. In each of the second pixel columns 74b, the second focus detection pixels 60L are arranged in the vertical direction in the drawing.

With the use of the CS 61 shown in FIG. 6, the sensitivity of the first focus detection pixel 60R to the incident light $I_R$ increases, and the sensitivity of the second focus detection pixel 60L to the incident light $I_L$ increases. This causes disparity between the first focus detection image and the second focus detection image, in a manner similar to the CCD 70. Thereby, a stereo image is observed using the display section 26.

Note that in the CCDs 70 and 73, all the pixels are arranged in the square lattice form, but the pixel arrangement is not particularly limited, for example, any arrangement including the honeycomb array may be used.

In the above embodiments, the first focus detection pixel 30R is arranged adjacent to the second focus detection pixels 30L, and the first focus detection pixel 60R is arranged adjacent to the second focus detection pixel 60L. The normal pixel 30N or the like may be arranged between the first and second focus detection pixels 30R and 30L, or 60R and 60L. In the above embodiments, the CCD image sensor is described, but the present invention is also applicable to other solid state imaging devices such as a CMOS image sensor.

DESCRIPTION OF THE REFERENCE NUMERALS 16, 59 CCD
27 substrate voltage application circuit
29 semiconductor substrate
30N normal pixel
30R, 60R first focus detection pixel
30L, 60L second focus detection pixel
40N, 40R, 40L photodiode (PD)
38 overflow barrier layer
38a high concentration barrier layer
38b low concentration barrier layer 52Ra, 52La first photoelectric conversion area
52Rb, 52Lb second photoelectric conversion area
61 channel stopper
62R, 62L photodiode
63Ra, 63La first photoelectric conversion area
63Rb, 63Lb second photoelectric conversion area

The invention claimed is:

1. A solid state imaging device comprising:
a semiconductor substrate;
an impurity layer formed over the semiconductor substrate;
a plurality of pixels arranged in a predetermined pattern over the impurity layer, the pixels having photodiodes for generating signal charge through photoelectric conversion and accumulating the signal charge, the pixels producing an image signal of a subject image formed by an optical system, the pixels including at least a pair of two types of focus detection pixels for producing an image signal for focus detection of the optical system using a phase difference method; and
an area control layer formed between the semiconductor substrate and the two types of the focus detection pixels, the area control layer making thickness of one of first and second photoelectric conversion areas less than thickness of the other in the photodiode of each of the two types of the focus detection pixels, the first photoelectric conversion areas of the photodiodes of the two types of the focus detection pixels face toward each other, the second photoelectric conversion area being on opposite side of the first photoelectric conversion area in the each photodiode.

2. The solid state imaging device claimed in claim 1, wherein the semiconductor substrate is of a first conductive type, and a first voltage is applied from a voltage application circuit to the semiconductor substrate,
and the area control layer is formed between the semiconductor substrate and the impurity layer, and the area control layer is an overflow barrier layer of a second conductive type, being a potential barrier against the signal charge from the photodiode to the semiconductor substrate, and the overflow barrier layer has a first barrier layer and a second barrier layer, and the first barrier layer is positioned below the first photoelectric conversion area, and the second barrier layer is an area other than the first barrier layer, and impurity concentration of the second conductive type of the second barrier layer is lower than impurity concentration of the second conductive type of the first barrier layer,
and when the first voltage is applied to the semiconductor substrate, the potential barrier of the second barrier layer is lowered and the signal charge generated in a portion of the second photoelectric conversion area on a second barrier layer side is discharged to the semiconductor substrate, and the potential barrier of the first barrier layer is maintained at a level to block discharge of the signal charge to the semiconductor substrate from the first photoelectric conversion area.

3. The solid state imaging device claimed in claim 2, wherein the voltage application circuit selectively applies the first voltage or a second voltage to the semiconductor substrate, and the second voltage is lower than the first voltage,
and the potential barrier of the second barrier layer is maintained at a level to block discharge of the signal charge to the semiconductor substrate from the second photoelectric conversion area when the second voltage is applied to the semiconductor substrate.

4. The solid state imaging device claimed in claim 1, wherein the area control layer is positioned between the first photoelectric conversion area and the semiconductor substrate, and the area control layer has a shape in which a top face of the area control layer on the first photoelectric conversion area side is positioned higher than a bottom face of the second photoelectric conversion area.

5. The solid state imaging device claimed in claim 4, wherein a channel stopper is formed between the photodiodes adjacent to each other, and the area control layer is formed integrally with the channel stopper.

6. The solid state imaging device claimed in claim 1, wherein the pixels are normal pixels used only for imaging, and the two types of the focus detection pixels.

7. The solid state imaging device claimed in claim 2, wherein the pixels are normal pixels used only for imaging, and the two types of the focus detection pixels.

8. The solid state imaging device claimed in claim 3, wherein the pixels are normal pixels used only for imaging, and the two types of the focus detection pixels.

9. The solid state imaging device claimed in claim 4, wherein the pixels are normal pixels used only for imaging, and the two types of the focus detection pixels.

10. The solid state imaging device claimed in claim 5, wherein the pixels are normal pixels used only for imaging, and the two types of the focus detection pixels.

11. The solid state imaging device claimed in claim 1, wherein all the pixels are the two types of the focus detection pixels.

12. The solid state imaging device claimed in claim 2, wherein all the pixels are the two types of the focus detection pixels.

13. The solid state imaging device claimed in claim 3, wherein all the pixels are the two types of the focus detection pixels.

14. The solid state imaging device claimed in claim 4, wherein all the pixels are the two types of the focus detection pixels.

15. The solid state imaging device claimed in claim 5, wherein all the pixels are the two types of the focus detection pixels.

16. The solid state imaging device claimed in claim 11, wherein the solid state imaging device has first pixel columns and second pixel columns, and the first pixel column is composed of first pixels aligned in a line in the first direction, and the second pixel column is composed of second pixels aligned in a line in the first direction, and the first pixel is one of the two types of the focus detection pixels, and the second pixel is the other of the two types of the focus detection pixels, and the first and second pixel columns are arranged alternately in a second direction orthogonal to the first direction.

17. A digital camera comprising:
(A) a solid state imaging device comprising:
(A1) a semiconductor substrate;
(A2) an impurity layer formed over the semiconductor substrate;
(A3) first focus detection pixels and second focus detection pixels formed over the impurity layer, the first and second focus detection pixels having photodiodes for photoelectrically converting a subject image formed by an optical system and generating and accumulating signal charge, the first and second focus detection pixels generating image signals for focus detection of the optical system using a phase difference method so as to control AF, the first and second focus detection pixels being formed in a pattern of first pixel columns and second pixel columns, the first pixel column having the first focus detection pixels aligned in a line in a first direction, the second pixel column having the second focus detection pixels aligned in a line in the first direction, the first and second pixel columns being arranged alternately in a second direction orthogonal to the first direction;

(A4) an area control layer formed between the semiconductor substrate and the first and second focus detection pixels, the area control layer making thickness of one of first and second photoelectric conversion areas less than thickness of the other in the photodiode of each of the two types of the focus detection pixels, the first photoelectric conversion areas of the photodiodes of the two types of the focus detection pixels face toward each other, the second photoelectric conversion area being on opposite side of the first photoelectric conversion area in the each photodiode; and (B) an image processor for producing a disparity image from a first image and a second image, the first image being produced from the image signal from the first focus detection pixels, the second image being produced from the image signal from the second focus detection pixels.

* * * * *